United States Patent
Nakai et al.

(10) Patent No.: US 10,903,092 B2
(45) Date of Patent: Jan. 26, 2021

(54) SUBSTRATE PROCESSING APPARATUS AND SUBSTRATE PROCESSING METHOD

(71) Applicant: SCREEN Holdings Co., Ltd., Kyoto (JP)

(72) Inventors: Hitoshi Nakai, Kyoto (JP); Koji Ando, Kyoto (JP)

(73) Assignee: SCREEN Holdings Co., Ltd.

( * ) Notice: Subject to any disclaimer, the term of this patent is extended or adjusted under 35 U.S.C. 154(b) by 196 days.

(21) Appl. No.: 16/069,532

(22) PCT Filed: Jan. 24, 2017

(86) PCT No.: PCT/JP2017/002401
§ 371 (c)(1),
(2) Date: Jul. 12, 2018

(87) PCT Pub. No.: WO2017/159052
PCT Pub. Date: Sep. 21, 2017

(65) Prior Publication Data
US 2019/0027383 A1     Jan. 24, 2019

(30) Foreign Application Priority Data
Mar. 17, 2016   (JP) ................. 2016-053268

(51) Int. Cl.
*H01L 21/67* (2006.01)
*B08B 3/08* (2006.01)
(Continued)

(52) U.S. Cl.
CPC .......... *H01L 21/67051* (2013.01); *B08B 3/08* (2013.01); *B08B 3/10* (2013.01);
(Continued)

(58) Field of Classification Search
None
See application file for complete search history.

(56) References Cited

U.S. PATENT DOCUMENTS

| | | | |
|---|---|---|---|
| 5,882,433 A | 3/1999 | Ueno | 134/31 |
| 2003/0168086 A1 | 9/2003 | Yamaguchi et al. | 134/30 |

(Continued)

FOREIGN PATENT DOCUMENTS

| | | |
|---|---|---|
| JP | 2007-335815 A | 12/2007 |
| JP | 2010-129809 A | 6/2010 |

(Continued)

OTHER PUBLICATIONS

International Search Report dated Feb. 28, 2017 in corresponding PCT International Application No. PCT/JP2017/002401.

(Continued)

*Primary Examiner* — Eric W Golightly
(74) *Attorney, Agent, or Firm* — Ostrolenk Faber LLP (57) ABSTRACT

Pure water, a mixed solution, and an organic solvent are applied to a substrate in this order. The organic solvent is then removed by rotation. The mixed solution is a mixture of pure water and the organic solvent, and has a surface tension lower than that of the pure water. Since the mixed solution has a solubility in pure water, which is higher than that of the organic solvent, local drying on the upper surface becomes less likely at an interface between the mixed solution and the pure water, which suppresses collapse of pattern elements. Since the temperature of the substrate is raised by the mixed solution having a temperature higher than room temperature, it is possible to reduce the time required for a process related to drying.

7 Claims, 4 Drawing Sheets

(51) Int. Cl.
  *B08B 3/10* (2006.01)
  *C11D 7/50* (2006.01)
  *F26B 5/08* (2006.01)
  *H01L 21/02* (2006.01)
  *H01L 21/687* (2006.01)
(52) U.S. Cl.
  CPC .............. *C11D 7/5022* (2013.01); *F26B 5/08* (2013.01); *H01L 21/02057* (2013.01); *H01L 21/67028* (2013.01); *H01L 21/68714* (2013.01)

(56) References Cited

U.S. PATENT DOCUMENTS

| | | | |
|---|---|---|---|
| 2007/0289611 A1* | 12/2007 | Hayashi | H01L 21/02052 |
| | | | 134/26 |
| 2008/0078426 A1 | 4/2008 | Miya et al. | 134/30 |
| 2012/0103371 A1* | 5/2012 | Yun | H01L 21/67034 |
| | | | 134/26 |
| 2014/0093644 A1 | 4/2014 | Fujii | 427/240 |
| 2015/0090296 A1 | 4/2015 | Nagashima et al. | 134/19 |

FOREIGN PATENT DOCUMENTS

| | | |
|---|---|---|
| JP | 4767767 B2 | 9/2011 |
| JP | 5114252 B2 | 1/2013 |
| JP | 5139844 B2 | 2/2013 |
| JP | 2013-542607 A | 11/2013 |
| JP | 2014-072439 A | 4/2014 |
| JP | 2015-092539 A | 5/2015 |
| KR | 10-0220028 B1 | 12/1996 |
| KR | 10-2007-0120431 A | 12/2007 |
| KR | 10-2008-0029779 A | 4/2008 |
| KR | 10-2014-0086885 A | 7/2014 |
| TW | 559935 B | 11/2003 |

OTHER PUBLICATIONS

Written Opinion dated Feb. 28, 2017 in corresponding PCT International Application No. PCT/JP2017/002401.

Office Action dated Oct. 21, 2019 in counterpart Korean Patent Application No. 10-2018-7022272.

PCT/IB/326 Notification Concerning Transmittal of International Preliminary Report on Patentability including PCT/IB/373 and PCT/ISA/237 (in Japanese) dated Sep. 27, 2018 for International Application No. PCT/JP2017/002401.

PCT/IB/338 Notification of Transmittal of Translation of the International Preliminary Report on Patentability including PCT/IB/373 and PCT/ISA/237 (in English) dated Sep. 27, 2018 for International Application No. PCT/JP2017/002401.

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2017/002401, filed Jan. 24, 2017, which claims priority to Japanese Patent Application No. 2016-053268, filed Mar. 17, 2016, the contents of both of which are incorporated herein by reference. The PCT International Application was published in the Japanese language.

TECHNICAL FIELD

The present invention relates to a substrate processing apparatus and a substrate processing method.

BACKGROUND ART

In a process of manufacturing a semiconductor substrate (hereinafter, referred to simply as a "substrate"), conventionally, various processings are performed on a substrate by using a substrate processing apparatus. By supplying a chemical liquid onto a substrate having a surface on which a resist pattern is formed, for example, a processing such as etching or the like is performed on the surface of the substrate. After supplying the chemical liquid, a rinse process for removing the chemical liquid from the surface by supplying pure water onto the substrate and a drying process for removing the pure water from the surface by rotating the substrate at high speed.

In drying the substrate, replacement of the pure water on the substrate with an organic solvent (IPA (isopropyl alcohol) or the like) having a surface tension lower than that of pure water is also performed. By this replacement, it is possible to prevent pattern elements on the substrate from being collapsed due to the surface tension of the pure water during drying. U.S. Pat. No. 5,114,252 (Document 1), for example, discloses a method in which a liquid film of pure water is formed on a substrate and the pure water on the substrate is replaced with a low surface tension solvent having a surface tension lower than that of pure water, and after that, the low surface tension solvent is removed from a surface of the substrate and the surface of the substrate is dried.

Further, in an apparatus disclosed in Patent Publication No. 4767767 (Document 2), following a cleaning process of a substrate using pure water, a drying preprocessing liquid is supplied onto a main surface of the substrate and the pure water remaining on the main surface is replaced with the drying preprocessing liquid, and after that, the drying preprocessing liquid is removed and the substrate is dried. The drying preprocessing liquid is a mixed solution containing pure water and an organic solvent having a volatility higher than that of pure water, and during supplying the mixed solution onto the substrate, the ratio of the organic solvent in the mixed solution is increased. Patent Publication No. 5139844 (Document 3) discloses a method in which concurrently with a process of supplying a low surface tension liquid of room temperature onto a surface of a substrate to which a rinse liquid is adhered, hot water of high temperature is supplied onto a back surface of the substrate, to thereby raise the temperature of the low surface tension liquid on the surface of the substrate. In the method, the efficiency of replacement of the rinse liquid with the low surface tension liquid on the surface of the substrate can be increased and it is possible to excellently remove the rinse liquid from the surface of the substrate.

Incidentally, in the case where the liquid film of pure water is formed on the substrate, as shown in Document 1, since it is necessary to maintain a state in which the number of rotations of the substrate is lowered for a certain time period, the time required for a process related to drying, after the rinse process until drying of the substrate is completed, disadvantageously becomes longer. On the other hand, as shown in Document 3, in the case where the low surface tension liquid (IPA) is directly supplied onto the main surface without forming any liquid film of pure water after the rinse process using the pure water, pattern elements may be sometimes collapsed depending on the shape, the size, the arrangement, and the like of the pattern elements. Also in the apparatus disclosed in Document 2, it requires a certain time to remove the drying preprocessing liquid (dry the substrate). Therefore, required is a method which makes it possible to suppress the collapse of the pattern elements and reduce the time required for the process related to drying.

SUMMARY OF INVENTION

The present invention is intended for a substrate processing apparatus, and it is an object of the present invention to suppress collapse of pattern elements and reduce the time required for a process related to drying.

The substrate processing apparatus according to the present invention includes a substrate holding part for holding a substrate, a substrate rotating mechanism for rotating the substrate holding part together with the substrate, a pure water supply part for supplying pure water onto a main surface of the substrate, which faces upward, a mixed solution supply part for supplying a mixed solution onto the main surface, the mixed solution having a temperature higher than a room temperature and being prepared by mixing pure water with an organic solvent having a surface tension lower than that of pure water, an organic solvent supply part for supplying the organic solvent onto the main surface, and a control part for causing the pure water supply part, the mixed solution supply part, and the organic solvent supply part to supply the pure water, the mixed solution, and the organic solvent, respectively, in this order onto the main surface of the substrate which is being rotated by the substrate rotating mechanism and then removing the organic solvent from the main surface by rotation of the substrate.

By the present invention, it is possible to suppress collapse of pattern elements and reduce the time required for a process related to drying.

In one preferred embodiment of the present invention, the mixed solution is prepared by mixing an organic solvent of room temperature with heated pure water.

In this case, preferably, a concentration of the organic solvent in the mixed solution is not higher than 50 vol %.

The present invention is also intended for a substrate processing method. The substrate processing method includes a) supplying pure water onto a main surface of a substrate being rotated, which faces upward, b) supplying a mixed solution onto the main surface of the substrate being rotated, the mixed solution having a temperature higher than a room temperature and being prepared by mixing pure water with an organic solvent having a surface tension lower than that of pure water, c) supplying the organic solvent onto the main surface of the substrate being rotated, and d) removing the organic solvent from the main surface by rotation of the substrate.

These and other objects, features, aspects and advantages of the present invention will become more apparent from the following detailed description of the present invention when taken in conjunction with the accompanying drawings.

DESCRIPTION OF EMBODIMENTS

Figure 1:
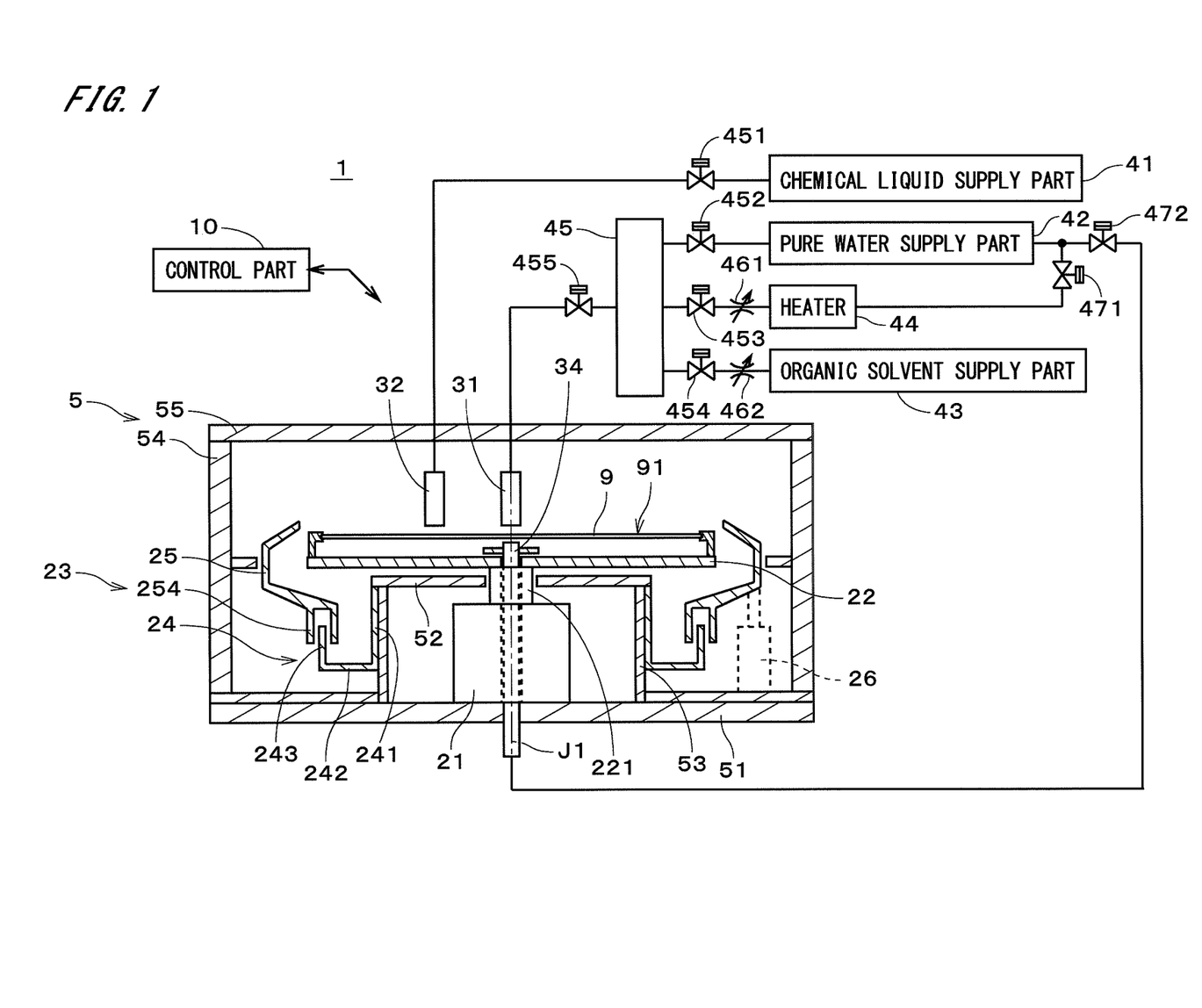
FIG. 1 is a view showing a configuration of a substrate processing apparatus.

FIG. 1 is a view showing a configuration of a substrate processing apparatus 1 in accordance with one preferred embodiment of the present invention. Constituent elements of the substrate processing apparatus 1 is controlled by the control part 10. The substrate processing apparatus 1 includes a spin chuck 22, a spin motor 21, a cup part 23, and a chamber 5. The spin chuck 22 serving as a substrate holding part brings a plurality of grasping members into contact with a peripheral edge of the substrate 9, to thereby grasp the substrate 9. The substrate 9 is thereby held by the spin chuck 22 in a horizontal state. In the following description, a main surface 91 of the substrate 9, which faces upward, is referred to as an "upper surface 91". On the upper surface 91, formed is a predetermined pattern, and the pattern includes, for example, a lot of pattern elements standing upright.

To the spin chuck 22, connected is a shaft 221 extending in an up-and-down direction (vertical direction). The shaft 221 is perpendicular to the upper surface 91 of the substrate 9 and a central axis J1 of the shaft 221 passes through a center of the substrate 9. The spin motor 21 serving as a substrate rotating mechanism rotates the shaft 221. The spin chuck 22 and the substrate 9 are thereby rotated around the central axis J1 oriented in the up-and-down direction. The shaft 221 and the spin motor 21 each have a hollow structure and a lower nozzle 34 described later is disposed inside them.

The cup part 23 includes a liquid receiving part 24 and a guard part 25. The liquid receiving part 24 includes a base part 241, an annular bottom 242, and a peripheral wall part 243. The base part 241 has a tubular shape around the central axis J1. The base part 241 is fit in a chamber inner sidewall 53 described later and attached onto an outer surface of the chamber inner sidewall 53. The annular bottom 242 has an annular disk-like shape around the central axis J1 and extends outward from a lower end portion of the base part 241. The peripheral wall part 243 has a tubular shape around the central axis J1 and protrudes upward from an outer peripheral portion of the annular bottom 242. The base part 241, the annular bottom 242, and the peripheral wall part 243 are preferably formed integrally as one member.

The guard part 25 is a member having a substantially cylindrical shape around the central axis J1 and surrounds the periphery of the spin chuck 22. At a lower portion of the guard part 25, provided is an engagement part 254 which forms a very small gap in a space between the peripheral wall part 243 and itself. The engagement part 254 and the peripheral wall part 243 keep a state out of contact with each other. The guard part 25 is movable in the up-and-down direction by a guard up-and-down moving mechanism 26.

The chamber 5 includes a chamber bottom 51, a chamber upper bottom 52, a chamber inner sidewall 53, a chamber outer sidewall 54, and a chamber top cover 55. The chamber bottom 51 has a plate-like shape and covers a portion below the spin motor 21 and the cup part 23. The chamber upper bottom 52 has a substantially annular disk-like shape around the central axis J1. Above the chamber bottom 51, the chamber upper bottom 52 covers a portion above the spin motor 21 and a portion below the spin chuck 22. The chamber inner sidewall 53 has a substantially cylindrical shape around the central axis J1. The chamber inner sidewall 53 extends downward from an outer peripheral portion of the chamber upper bottom 52 and reaches the chamber bottom 51. The chamber inner sidewall 53 is positioned inside the cup part 23 in a radial direction.

The chamber outer sidewall 54 has a substantially tubular shape and is positioned outside the cup part 23 in the radial direction. The chamber outer sidewall 54 extends upward from an outer peripheral portion of the chamber bottom 51 and reaches an outer peripheral portion of the chamber top cover 55. The chamber top cover 55 has a plate-like shape and covers a portion above the cup part 23 and the spin chuck 22. The chamber outer sidewall 54 is provided with a loading and unloading port (not shown) used to load and unload the substrate 9 to/from the inside of the chamber 5.

The substrate processing apparatus 1 further includes a first upper nozzle 31, a second upper nozzle 32, a lower nozzle 34, a chemical liquid supply part 41, a pure water supply part 42, an organic solvent supply part 43, and a heater 44. The first upper nozzle 31 is a straight nozzle extending, for example, in the up-and-down direction, and is attached to an arm of a not-shown nozzle moving mechanism. The nozzle moving mechanism rotates the arm around an axis in parallel with the central axis J1, to cause the first upper nozzle 31 to be selectively disposed at a facing position facing the upper surface 91 of the substrate 9 and at a waiting position out of above the upper surface 91. The first upper nozzle 31 disposed at the facing position faces a center portion of the upper surface 91. The waiting position is a position away from the substrate 9 in a horizontal direction. The nozzle moving mechanism can move the arm up and down in the up-and-down direction. Like the first upper nozzle 31, the second upper nozzle 32 is also selectively disposed at the facing position and at another waiting position by another nozzle moving mechanism. The lower nozzle 34 extending in the up-and-down direction is disposed inside the shaft 221 and the spin motor 21 which have a hollow structure. An upper end of the lower nozzle 34 faces a center portion of a lower surface of the substrate 9.

The chemical liquid supply part 41 is connected to the second upper nozzle 32 through an opening and closing valve 451, and the pure water supply part 42 is connected to a connecting part 45 through an opening and closing valve 452. The pure water supply part 42 is further connected to the heater 44 through an opening and closing valve 471 and connected to the lower nozzle 34 through an opening and closing valve 472. The heater 44 is connected to the connecting part 45 through a flow control valve 461 and an opening and closing valve 453, and the organic solvent supply part 43 is connected to the connecting part 45 through a flow control valve 462 and an opening and closing valve 454. A flow control valve may be provided between the second upper nozzle 32 and the chemical liquid supply part 41, and the like. The connecting part 45 is connected to the first upper nozzle 31 through an opening and closing valve 455. One multiple valve device (mixing valve) is constituted of, for example, the connecting part 45 and the plurality of opening and closing valves 452 to 455 provided in proximity to the connecting part 45. The chemical liquid supply part 41, the pure water supply part 42, and the organic solvent supply part 43 supply a chemical liquid, pure water, and an organic solvent which are processing liquids, respectively, onto the upper surface 91 of the substrate 9.

Figure 2:
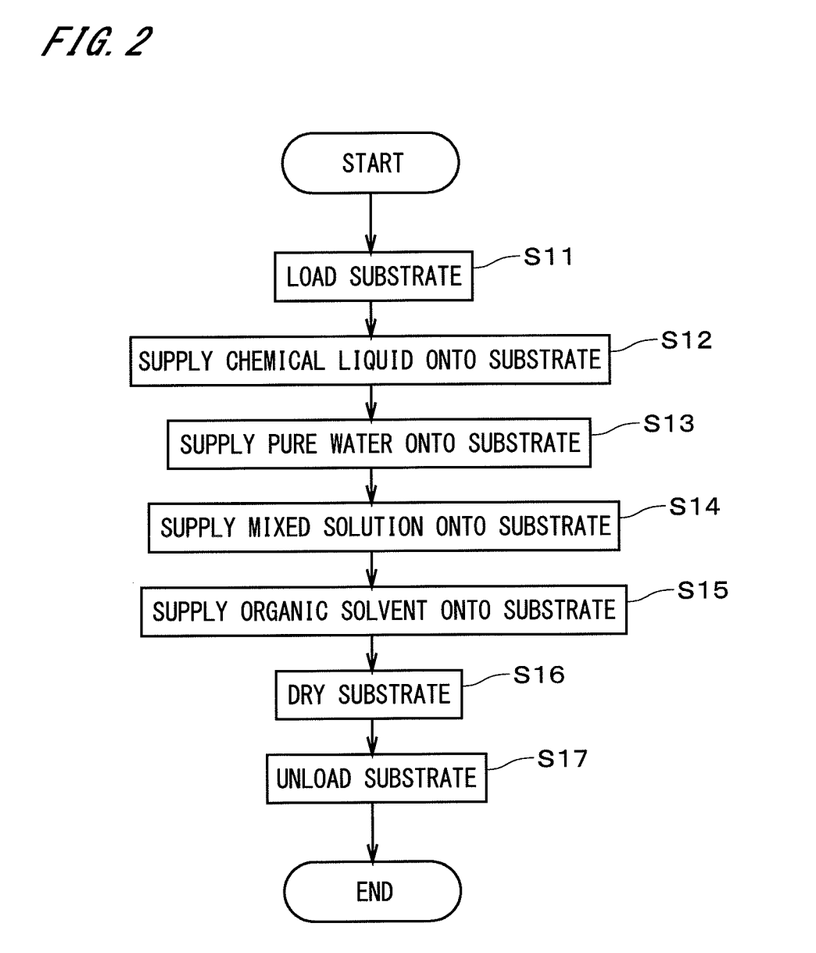
FIG. 2 is a flowchart showing an operation flow for processing a substrate.

FIG. 2 is a flowchart showing an operation flow for processing the substrate 9 in the substrate processing apparatus 1. First, an unprocessed substrate 9 is loaded into the inside of the chamber 5 by an external transfer mechanism and held by the spin chuck 22 (Step S11). In loading the substrate 9, since the guard up-and-down moving mechanism 26 is used to move down the guard part 25, it is possible to prevent the substrate 9 which is being loaded, from coming into contact with the guard part 25 (the same applies to unloading of the substrate 9 described later). After the transfer mechanism moves out of the chamber 5, the guard part 25 rises up to a position shown in FIG. 1 and an upper end of the guard part 25 is disposed at a level higher than the substrate 9.

Subsequently, the second upper nozzle 32 is disposed by the nozzle moving mechanism at the facing position facing the center portion of the upper surface 91 of the substrate 9, and the rotation of the substrate 9 at a predetermined number of rotations (rotation speed) is started by the spin motor 21. Then, by opening the opening and closing valve 451, the chemical liquid is continuously supplied onto the upper surface 91 through the second upper nozzle 32 (Step S12). The chemical liquid on the upper surface 91 is spread toward an outer edge portion by the rotation of the substrate 9 and the chemical liquid is supplied to the entire upper surface 91. Further, the chemical liquid spattering from the outer edge portion is received and collected by an inner surface of the cup part 23. The chemical liquid is a cleaning solution containing, for example, dilute hydrofluoric acid (DHF) or aqueous ammonia. This chemical liquid may be a chemical liquid used for any process, such as removal of an oxide film on the substrate 9, development, etching, or the like, other than the cleaning process. The supply of the chemical liquid continues for a predetermined time period and then is stopped by closing the opening and closing valve 451. In the processing using the chemical liquid, the second upper nozzle 32 may be oscillated by the nozzle moving mechanism in the horizontal direction. Concurrently with Step S12, the pure water may be supplied onto the lower surface of the substrate 9 through the lower nozzle 34 by the pure water supply part 42 (the same applies to Steps S13 to S15 described later).

Figure 3:
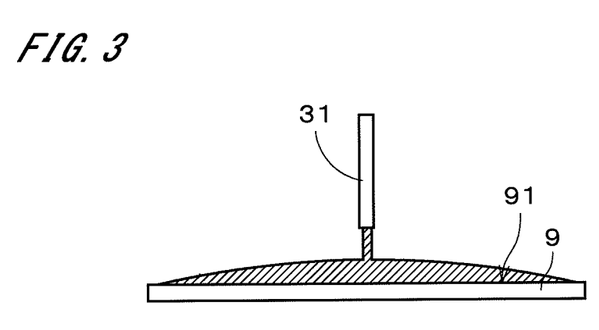
FIG. 3 is a view showing a processing liquid on an upper surface of the substrate.

After the processing using the chemical liquid is completed, the second upper nozzle 32 moves to the waiting position, and subsequently, the first upper nozzle 31 is disposed at the facing position. By opening the opening and closing valve 452, pure water (pure water of room temperature) serving as a rinse liquid is supplied into an internal space of the connecting part 45, and by opening the opening and closing valve 455, the pure water is continuously supplied onto the upper surface 91 through the first upper nozzle 31 (Step S13). A rinse process in which the chemical liquid on the upper surface 91 is rinsed out with the pure water is thereby performed. During the rinse process, as shown in FIG. 3, the entire upper surface 91 is covered with the pure water. Also during supplying the pure water, the rotation of the substrate 9 at a relatively high number of rotations is continued by the spin motor 21 shown in FIG. 1. For example, the number of rotations is 500 rpm, and the same applies to supply of a mixed solution described later. The pure water spattering from the substrate 9 is received by the inner surface of the cup part 23 and discharged to the outside.

After the supply of the pure water continues for a predetermined time period, the supply of the pure water is stopped by closing the opening and closing valve 452. Subsequently, the opening and closing valves 453 and 454 are opened at the same time. The pure water heated by the heater 44 (hereinafter, referred to as "warm pure water") and an organic solvent of room temperature are supplied into the internal space of the connecting part 45, and a mixed solution (dilute organic solvent) obtained by mixing the organic solvent with the warm pure water is generated in the connecting part 45.

Herein, the room temperature is a temperature around the substrate processing apparatus 1, for example, in the range of 20° C.±15° C. The temperature of the warm pure water is higher than the room temperature, for example, not lower than 50° C., and preferably not lower than 65° C. (actually, not higher than 90° C.). The opening and closing valve 471 is opened in advance, and the heater 44 can supply warm pure water of almost constant temperature. The organic solvent is, for example, IPA (isopropyl alcohol), methanol, ethanol, acetone, or the like, and has a surface tension lower than that of pure water. The organic solvent preferably has a vapor pressure higher than that of pure water. In the present preferred embodiment, IPA is used as the organic solvent.

Figure 4:
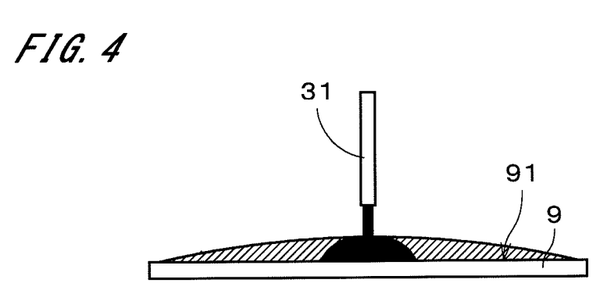
FIG. 4 is another view showing the processing liquid on the upper surface of the substrate.

The mixed solution is continuously supplied onto the upper surface 91 through the first upper nozzle 31 (Step S14). As shown in FIG. 4, the mixed solution supplied onto the center portion of the upper surface 91 is spread toward the outer edge portion by the rotation of the substrate 9, and the pure water on the upper surface 91 is replaced with the mixed solution. The mixed solution spattering from the substrate 9 is received by the inner surface of the cup part 23. In the supply of the mixed solution, the control part 10 controls the degree of opening of the flow control valve 462 connected to the organic solvent supply part 43 and the degree of opening of the flow control valve 461 connected to the heater 44, to thereby adjust a mixing ratio between the organic solvent and the warm pure water, i.e., a concentration of the organic solvent in the mixed solution to a predetermined value. The concentration of the organic solvent in the mixed solution will be described later. At that time, the temperature of the substrate 9 is also raised by the mixed solution having a temperature higher than the room temperature. Further, an inline mixer or the like may be provided between the first upper nozzle 31 and the connecting part 45.

After the supply of the mixed solution continues for a predetermined time period, the opening and closing valve 454 keeps opened and the opening and closing valve 453 is closed. With this operation, no warm pure water is supplied to the connecting part 45 and only the organic solvent (pure organic solvent) of almost room temperature is continuously supplied onto the upper surface 91 through the first upper nozzle 31 (Step S15). By the rotation of the substrate 9, the entire upper surface 91 is covered with the organic solvent. The organic solvent spattering from the substrate 9 is received by the inner surface of the cup part 23. In the present preferred embodiment, the number of rotations of the substrate 9 during supplying the organic solvent (for example, 200 rpm) is lower than that during supplying the mixed solution. Further, after a predetermined time has elapsed since the supply of only the organic solvent is started, by controlling the degree of opening of the flow control valve 462, the supply flow rate of the organic solvent is reduced. The thickness of a liquid film of the organic solvent on the upper surface 91 is thereby reduced.

After that, by closing the opening and closing valves 454 and 455, the discharge of the organic solvent from the first upper nozzle 31 is stopped. The first upper nozzle 31 positioned at the facing position is moved by the nozzle moving mechanism to the waiting position out of above the upper surface 91. Subsequently, the number of rotations of the substrate 9 is increased up to, for example, 1500 rpm and a drying process for removing the organic solvent on the upper surface 91 is thereby performed (Step S16). At that time, since the temperature of the substrate 9 becomes higher than the room temperature by the supply of the mixed solution, the volatility of the organic solvent becomes higher and drying of the substrate 9 is accelerated. After stopping the rotation of the substrate 9, the substrate 9 is unloaded to the outside of the chamber 5 by the external transfer mechanism (Step S17).

Herein, a comparative exemplary process in which a liquid film of pure water is formed (a so-called pure water puddle process is performed) after the rinse process using pure water will be described. In the comparative exemplary process, after the rinse process using pure water is performed on the upper surface 91 of the substrate 9, the number of rotations of the substrate 9 and the supply flow rate of the pure water are reduced, and a relatively thick liquid film of pure water is formed on the upper surface 91. The number of rotations of the substrate 9 is, for example, 10 rpm. Subsequently, the organic solvent is supplied onto the upper surface 91 and the liquid film of the organic solvent is formed. At that time, the organic solvent is spread entirely on the upper surface 91, entering between the liquid film of the pure water and the upper surface 91 of the substrate 9. In the comparative exemplary process, the mixed solution is not supplied. After supplying the organic solvent, the organic solvent on the upper surface 91 is removed by the rotation of the substrate 9. In the comparative exemplary process, since it is necessary to maintain the state in which the number of rotations of the substrate 9 is reduced for a certain time period in forming the liquid film of the pure water on the substrate 9, after the rinse process, the time required for the process related to drying until the drying of the substrate 9 is completed disadvantageously becomes longer (in other words, the throughput is reduced).

Further, in FIG. 2, assuming another comparative exemplary process in which the process in Step S14 of supplying the mixed solution onto the substrate 9 is omitted, in this comparative exemplary process, the supply of the organic solvent may sometimes cause the collapse of the pattern elements on the upper surface 91. Though the cause of the collapse of the pattern elements is not necessarily sure, a possible cause is occurrence of a local area in which very few pure water is present (in other words, an area in which there is only a very small amount of pure water by which an effect of surface tension can be produced on the pattern elements, and the area is hereinafter referred to as "local drying"). For example, the organic solvent supplied on the center portion of the upper surface 91 is so spread as to extrude the pure water on the upper surface 91 (a thin layer of pure water formed by high-speed rotation of the substrate 9) outward, in other words, is spread on the upper surface 91 so that an interface between the organic solvent and the pure water may move from the vicinity of the center portion toward the outer edge portion. At that time, due to low solubility between the organic solvent and the pure water (low mixability or affinity therebetween), it can be thought that the local drying of the upper surface 91 occurs at the interface therebetween. When the local drying occurs, the pattern elements are collapsed by the effect of surface tension of the pure water, which acts on the pattern elements.

On the other hand, in the substrate processing apparatus 1 shown in FIG. 1, onto the upper surface 91 of the substrate 9 being rotated, supplied are the pure water, the mixed solution, and the organic solvent in this order, and then the organic solvent on the upper surface 91 is removed by the rotation of the substrate 9. Since the mixed solution having a solubility in the pure water higher than that of the organic solvent in the pure water (and the difference in the surface tension between the pure water and the mixed solution is smaller than that between the pure water and the organic solvent) is supplied onto the upper surface 91 which has been supplied with the pure water, the local drying on the upper surface 91 becomes less likely to occur at the interface between the mixed solution and the pure water. As a result, it is possible to suppress the collapse of the pattern elements while omitting the process of forming the liquid film of the pure water. Further, since the temperature of the substrate 9 is raised by the mixed solution having a temperature higher than the room temperature, it is possible to dry the substrate 9 in a short time and reduce the time required for the process related to drying (increase the throughput).

In the substrate processing apparatus 1, since the mixed solution is supplied onto the upper surface 91 while the substrate 9 is rotated at a relatively high number of rotations, the mixed solution can be spread entirely on the upper surface 91 in a short time. Therefore, it is possible to reduce the time required to supply the mixed solution in Step S14, as compared with the process of forming the liquid film of the pure water, which is accompanied with low-speed rotation of the substrate for a certain time period. Actually, since the solubility between the mixed solution and the organic solvent is high, during supplying the organic solvent in Step S15, it is possible to fill very small gaps in the pattern elements with the organic solvent in a short time and reduce the time required for the supply of the organic solvent. Thus, by reducing the processing time of the Steps S14 and S15, it is possible to further reduce the time required for the process related to drying, in cooperation with the reduction in the time for the drying process in Step S16. Further, it is also possible to reduce the amount of organic solvent to be supplied in Step S15.

Herein, though there is a possible case where the temperature of the organic solvent is raised in preparing the mixed solution having a temperature higher than the room temperature, since the organic solvent has a high flammability, the cost of safety measures disadvantageously increases. On the other hand, in the substrate processing apparatus 1, the mixed solution having a temperature higher than the room temperature is prepared by mixing the organic solvent of room temperature with the heated pure water. It is thereby possible to easily prepare the mixed solution of high temperature while avoiding heating of the organic solvent accompanied with an increase in the cost in preparing the mixed solution.

In Steps S13 to S15, since the pure water, the mixed solution, and the organic solvent are sequentially discharged from the same nozzle, i.e., the first upper nozzle 31, it is possible to simplify the process related to the discharge of these processing liquids. Depending on the design of the substrate processing apparatus 1, the pure water, the mixed solution, and the organic solvent may be discharged from different nozzles.

Figure 5:
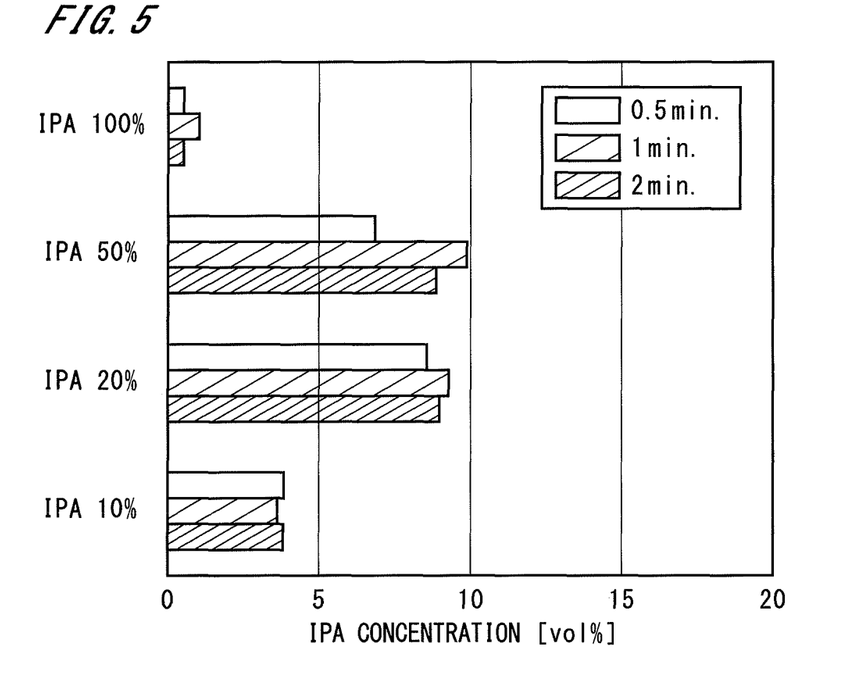
FIG. 5 is a graph showing a relation between the concentration of an organic solvent in a mixed solution and the solubility of the mixed solution and pure water.
Figure 6:
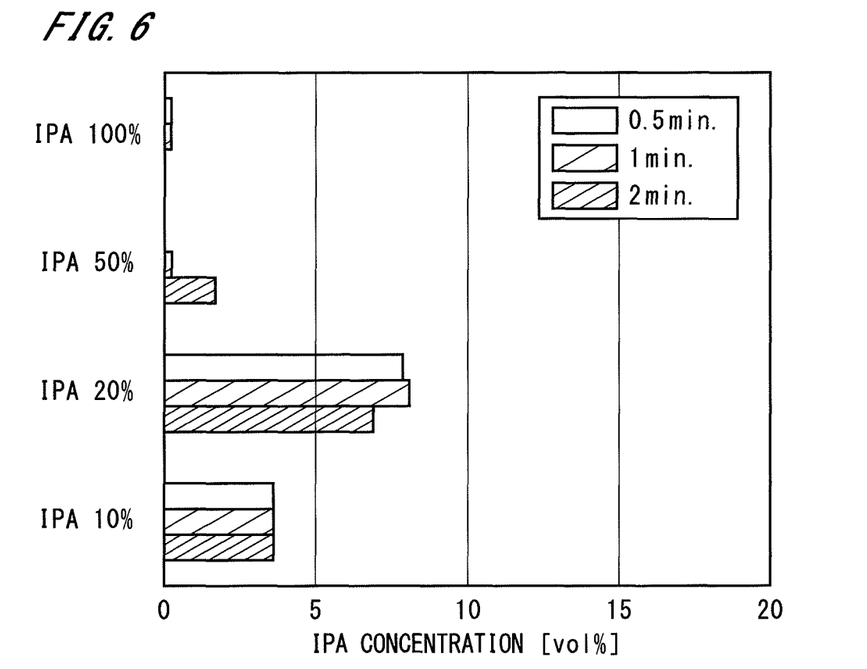
FIG. 6 is another graph showing a relation between the concentration of the organic solvent in the mixed solution and the solubility of the mixed solution and the pure water.

Next, the concentration of the organic solvent in the mixed solution will be described. FIGS. 5 and 6 are graphs each showing an experimental result on a relation between the concentration of the organic solvent (herein, IPA) in the mixed solution and the solubility of the mixed solution and pure water. In this experiment, tubes each having a diameter of 19 mm, one end of which is closed by a closing member, are prepared, and in a state where 15 cc of pure water of room temperature is stored in each of the tubes being extended in the up-and-down direction, 2 cc of mixed solutions having IPA concentrations of 10 vol % (volume percent concentration), 20 vol %, 50 vol %, and 100 vol % (pure organic solvent in a case where the IPA concentration is 100 vol %) are injected, respectively, along respective inner surfaces of the tubes. The closing member is provided with a sampling tube having a diameter of 3 mm, and a very small amount of liquid in the vicinity of the interface between the mixed solution and the pure water is extracted by the sampling tube after 0.5 minutes, 1 minute, and 2 minutes have elapsed from the injection of the mixed solution and the respective IPA concentrations of the liquids are measured. FIGS. 5 and 6 show IPA concentrations of liquids extracted at 5 mm and 10 mm away from the position of a liquid surface of pure water (the position corresponds to the interface between the mixed solution and the pure water) before the injection of the mixed solution toward the closing member side, respectively.

From FIGS. 5 and 6, in the case where the IPA concentration is 100 vol % (represented as "IPA 100%" in FIGS. 5 and 6 and the same applies to the following cases), an increase in the IPA concentration in the vicinity of the interface is small, and the solubility of the organic solvent in the pure water is low. On the other hand, in the cases where the IPA concentration is 10 vol %, 20 vol %, and 50 vol %, an increase in the IPA concentration in the vicinity of the interface is larger than that in the case of 100 vol %, and the solubility of the mixed solution in the pure water is high. Therefore, in order to more reliably suppress the local drying, it is preferable that the concentration of the organic solvent in the mixed solution should be not higher than 50 vol % and not lower than 10 vol %. Actually, by setting the concentration to not higher than 50 vol %, it is possible to increase the ratio of the warm pure water in the mixed solution (to not lower than 50%) and thereby possible to easily raise the temperature of the mixed solution. From the viewpoint of reducing the consumption of organic solvent and further raise the temperature of the mixed solution, the concentration should be preferably not hither than 30%, more preferably not higher than 20%. In this case, the solubility of the mixed solution in the pure water further increases.

In the above-described substrate processing apparatus 1, various modifications can be made.

Though the concentration of the organic solvent in the mixed solution is constant in the above-described preferred embodiment, the concentration of the organic solvent in the mixed solution may be increased step by step. In this case, in Step S14, the flow rate of the organic solvent supplied from the organic solvent supply part 43 to the connecting part 45 is gradually increased, and the flow rate of the pure water supplied from the heater 44 to the connecting part 45 is gradually reduced.

Depending on the design of the substrate processing apparatus 1, the mixed solution having a temperature higher than the room temperature may be prepared by heating a mixed solution obtained by mixing the organic solvent of room temperature with the pure water of room temperature.

In the substrate processing apparatus 1, though the mixed solution supply part which supplies the mixed solution having a temperature higher than the room temperature onto the upper surface 91 is constituted of the pure water supply part 42, the organic solvent supply part 43, the heater 44, and the connecting part 45 as main constituent elements, the mixed solution supply part may be realized independently of the pure water supply part 42 and the organic solvent supply part 43.

The substrate 9 may be held in various manners. For example, with a substrate holding part which supports the lower surface of the substrate 9, the substrate 9 may be held in a state where the main surface with the pattern formed thereon faces upward.

The substrate to be processed in the substrate processing apparatus 1 is not limited to a semiconductor substrate, but may be a glass substrate or any other substrate.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
9 Substrate
10 Control part
21 Spin motor
22 Spin chuck
42 Pure water supply part
43 Organic solvent supply part
44 Heater
45 Connecting part
91 Upper surface (of substrate)
S11 to S17 Step

The invention claimed is:

1. A substrate processing method, comprising:
a) supplying pure water onto a main surface of a substrate being rotated, which faces upward;
b) supplying a mixed solution onto said main surface of said substrate being rotated, said mixed solution having a temperature higher than a room temperature and being prepared by mixing heated pure water that is at a temperature higher than said room temperature with an organic solvent that is at said room temperature and has a surface tension lower than that of pure water;
c) supplying said organic solvent onto said main surface of said substrate being rotated; and
d) removing said organic solvent from said main surface by rotation of said substrate.

2. The substrate processing method according to claim 1, wherein a concentration of said organic solvent in said mixed solution is not higher than 50 vol %.

3. The substrate processing method according to claim 1, wherein said substrate is rotated more slowly during said supplying said organic solvent step than during said supplying said mixed solution step.

4. The substrate processing method according to claim 3, further comprising reducing a flow rate of said organic solvent onto said main surface of said substrate after a predetermined amount of time from a start of said supplying said organic solvent step.

5. The substrate processing method according to claim 1, wherein said mixed solution is prepared by supplying pure water from a pure water supply part to a connecting part through a heater to heat said pure water to said temperature that is higher than said room temperature; supplying said organic solvent at said room temperature from an organic solvent supply part to said connecting part; and mixing said heated pure water with said organic solvent in said connecting part.

6. The substrate processing method according to claim 1, wherein said substrate is heated to a temperature above said room temperature in said supplying said mixed solution step and said organic solvent at said room temperature is supplied onto said main surface of said heated substrate in said supplying said organic solvent step.

7. The substrate processing method according to claim 6, wherein while the heated substrate remains at a temperature above said room temperature said heated substrate is rotated in said removing said organic solvent.

* * * * *